(12) United States Patent
Lin et al.

(10) Patent No.: US 11,209,294 B2
(45) Date of Patent: Dec. 28, 2021

(54) THIN PROXIMITY SENSING DEVICE

(71) Applicant: inFilm Optoelectronic Inc., Grand Cayman (KY)

(72) Inventors: Chih-Hsiung Lin, Grand Cayman (KY); Shih-Yuan Chang, Grand Cayman (KY)

(73) Assignee: inFilm Optoelectronic Inc., Grand Cayman (KY)

( * ) Notice: Subject to any disclaimer, the term of this patent is extended or adjusted under 35 U.S.C. 154(b) by 99 days.

(21) Appl. No.: 16/886,196

(22) Filed: May 28, 2020

(65) Prior Publication Data

US 2020/0408576 A1 Dec. 31, 2020

(30) Foreign Application Priority Data

Jun. 25, 2019 (CN) .......................... 201910555240.0

(51) Int. Cl.
*G01D 11/26* (2006.01)
*G01B 7/02* (2006.01)

(52) U.S. Cl.
CPC ............. *G01D 11/26* (2013.01); *G01B 7/023* (2013.01)

(58) Field of Classification Search
CPC ................................ G01D 11/26; G01B 7/023
See application file for complete search history.

(56) References Cited

U.S. PATENT DOCUMENTS

| | | | |
|---|---|---|---|
| 2019/0171302 A1* | 6/2019 | Su ........................... | G06F 3/016 |
| 2019/0297279 A1* | 9/2019 | Wang ................... | H04N 5/2254 |
| 2019/0377400 A1* | 12/2019 | Zhang ................... | G06F 1/3287 |
| 2020/0132521 A1* | 4/2020 | Akiba ............... | B32B 17/10137 |

* cited by examiner

*Primary Examiner* — Jamel E Williams
(74) *Attorney, Agent, or Firm* — Rabin & Berdo, P.C.

(57) ABSTRACT

A thin proximity sensing device includes a transparent plate and a light sensor. The transparent plate includes a first surface and a second surface. The first surface is provided with a light source and a light entering area. The light source is arranged on the first surface. The second surface is provided with a reflector. The light sensor includes a light receiving area. The light sensor is arranged on the transparent plate. The reflector is capable of correspondingly reflecting specific incident light. The specific incident light refers to light that enters the transparent plate through the light entering area on the first surface after the light emitted by the light source is reflected externally, and is incident to the reflector. After reflected by the reflector, the specific incident light is reflected one or more times within the thickness of the transparent plate and is transmitted to the light sensor.

11 Claims, 8 Drawing Sheets

THIN PROXIMITY SENSING DEVICE

CROSS-REFERENCE TO RELATED APPLICATION

This non-provisional application claims priority under 35 U.S.C. § 119(a) to Patent Application No. 201910555240.0 filed in China, P.R.C. on Jun. 25, 2019, the entire contents of which are hereby incorporated by reference.

BACKGROUND

Technical Field

The instant disclosure relates to a sensing device, and in particular to a thin proximity sensing device.

Related Art

Proximity sensor, also known as distance sensor, is a kind of sensor which can detect nearby objects without contacting. According to the sensing type, proximity sensor may be divided into inductive type, electrostatic capacity type, ultrasonic type, optical type, magnetic type, etc.

Taking an optical proximity sensor as an example, it generally detects a nearby object or the proximity of an object according to the reflection or change of light by emitting light. However, at present, the reflected light received by the optical proximity sensor is easily interfered by other external light (for example, sunlight, illuminating light or ambient light), and the accuracy of object sensing is not good.

SUMMARY

In view of the above, in one embodiment, the instant disclosure provides a thin proximity sensing device, including a transparent plate and a light sensor. The transparent plate has a thickness and includes a first surface and an opposite second surface. The first surface is provided with a light source and a light entering area. The light source is arranged on the first surface along a direction of emitting light towards outside of the transparent plate. The light source and the light entering area are located at different positions on the first surface. The second surface is provided with a reflector corresponding to the light entering area. The light sensor includes a light receiving area. The light sensor is arranged on the transparent plate, with the light receiving area facing to a thickness direction of the transparent plate. The reflector is capable of correspondingly reflecting specific incident light. The specific incident light refers to light that enters the transparent plate through the light entering area on the first surface after the light emitted by the light source is reflected externally, and is incident to the reflector. After reflected by the reflector, the specific incident light is reflected one or more times within the thickness of the transparent plate and is transmitted to the light sensor.

Based on the above, the thin proximity sensing device according to the embodiment of the instant disclosure is capable of correspondingly reflecting specific incident light through the reflector, such that the specific incident light can be reflected one or more times within the thickness of the transparent plate and is transmitted to the light sensor, so as to achieve the effects of preventing the thin proximity sensing device from being interfered by other external light (for example, sunlight, illuminating light or ambient light), and greatly improving the accuracy of object sensing.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
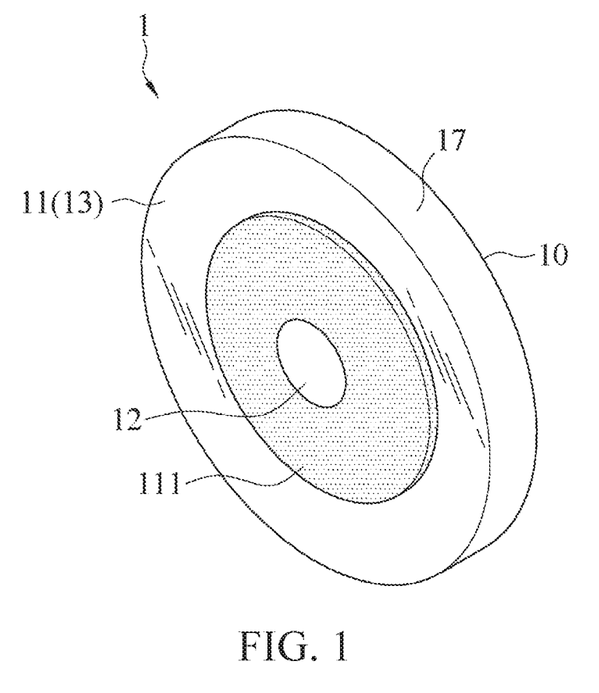
FIG. 1 illustrates a three-dimensional view of a first embodiment of a thin proximity sensing device according to the instant disclosure.
Figure 2:
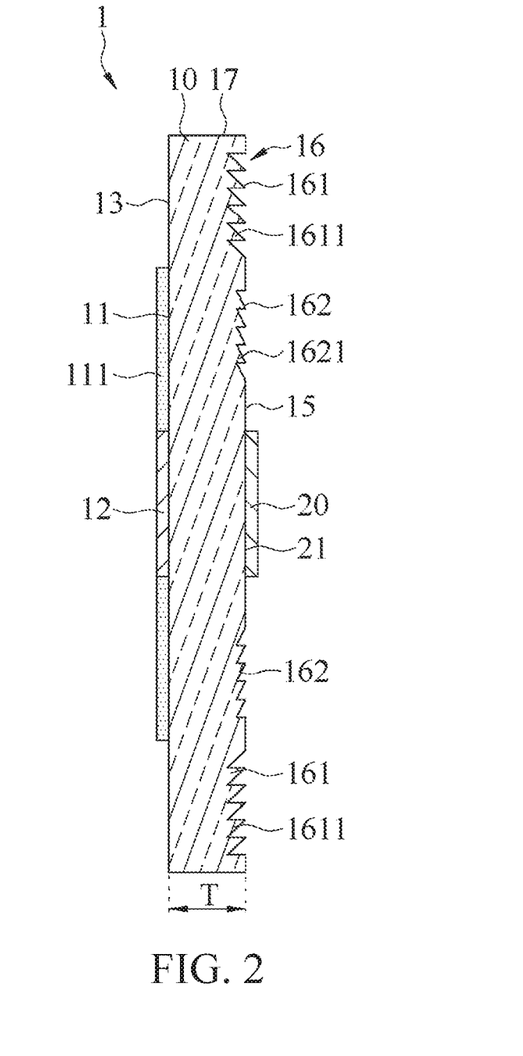
FIG. 2 illustrates a cross-sectional view of the first embodiment of the thin proximity sensing device according to the instant disclosure.

Various embodiments are described below in detail. However, the embodiments are only described as examples and are not intended to limit the protection scope of the instant disclosure. In addition, some components are omitted in the drawings of the embodiments to clearly show the technical features of the instant disclosure. The same reference numbers are used in the drawings to indicate the same or similar components. FIG. 1 is a three-dimensional view of a thin proximity sensing device according to embodiment 1 of the instant disclosure. FIG. 2 is a cross-sectional view of the thin proximity sensing device according to embodiment 1 of the instant disclosure. As shown in FIG. 1 and FIG. 2, the thin proximity sensing device 1 according to the embodiment of the instant disclosure includes a transparent plate 10 and a light sensor 20. In some embodiments, the thin proximity sensing device 1 may be used to sense whether an external object is located at a specific position or a specific distance, thereby generating a corresponding signal. For example, the thin proximity sensing device 1 may be applied to a switch device. When the thin proximity sensing device 1 senses that an external object passes through a specific position or is located at a specific distance, a corresponding switching signal may be generated. Alternatively, the thin proximity sensing device 1 may be applied to a portable device (for example, a smart phone or a tablet computer). When the thin proximity sensing device 1 senses that an external object is proximate to a specific position or is located at a specific distance, a corresponding proximity signal may be generated.

As shown in FIG. 1 and FIG. 2, the transparent plate 10 includes a first surface 11, a second surface 15 and a circumferential surface 17. The circumferential surface 17 is connected to the outer circumferences of the first surface 11 and the second surface 15. The transparent plate 10 has a thickness T to maintain the spacing between the first surface 11 and the second surface 15. In some embodiments, the transparent plate 10 may be specifically made of a light guide material. For example, the transparent plate 10 may be made of a transparent material such as polycarbonate (PC), acrylic plastic (PMMA), glass or other transparent plastics and has a light guide function. In addition, the transparent plate 10 may be a hard light guide thin sheet or a soft light guide thin film, such that the product which the thin proximity sensing device 1 is applied to be further thinned.

In some embodiments, the transparent plate 10 may be in a circular shape (as shown in FIG. 1), an oval shape, a square shape, a rectangular shape or other irregular shapes, but the instant disclosure is not limited thereto. In fact, the shape of the transparent plate 10 may be designed according to the demand of the product which it is applied.

As shown in FIG. 1 and FIG. 2, the first surface 11 of the transparent plate 10 is provided with a light source 12 and a light entering area 13. The light source 12 is arranged on the first surface 11 along a direction of emitting light towards outside of the transparent plate 10. For example, in the present embodiment, the light source 12 is arranged in the center of the first surface 11 and faces to a direction far away from the first surface 11, but the instant disclosure is not limited thereto. The light source 12 may also be arranged at other positions on the first surface 11. In some embodiments, the light source 12 may be a laser light source, an infrared light source, an LED light source, or the like.

As shown in FIG. 1 and FIG. 2, the light entering area 13 is a local area on the first surface 11 of the transparent plate 10. External light may enter the transparent plate 10 from the light entering area 13 on the first surface 11. The light entering area 13 and the light source 12 are located at different positions on the first surface 11. For example, in the present embodiment, the light entering area 13 is located around the first surface 11 and is a ring-shaped light entering area, the first surface 11 is further provided with a light shielding layer 111, and the light shielding layer 111 is located between the light source 12 and the light entering area 13, so as to prevent the external light from entering from the area which is not in the light entering area 13. For example, the light shielding layer 111 may be made of a dark material, for example, a dark thin film or thin sheet, so as to achieve the effect of shielding light. Alternatively, the light shielding layer 111 may also be made of a reflective material, for example, a reflective thin film or reflective thin sheet, so as to reflect the external light illuminating the light shielding layer 111 and prevent it from entering the transparent plate 10. However, the present embodiment is just an example. In some embodiments, the light entering area 13 may be located in other areas on the first surface 11, or the transparent plate 10 may not be provided with the light shielding layer 111.

Figure 8:
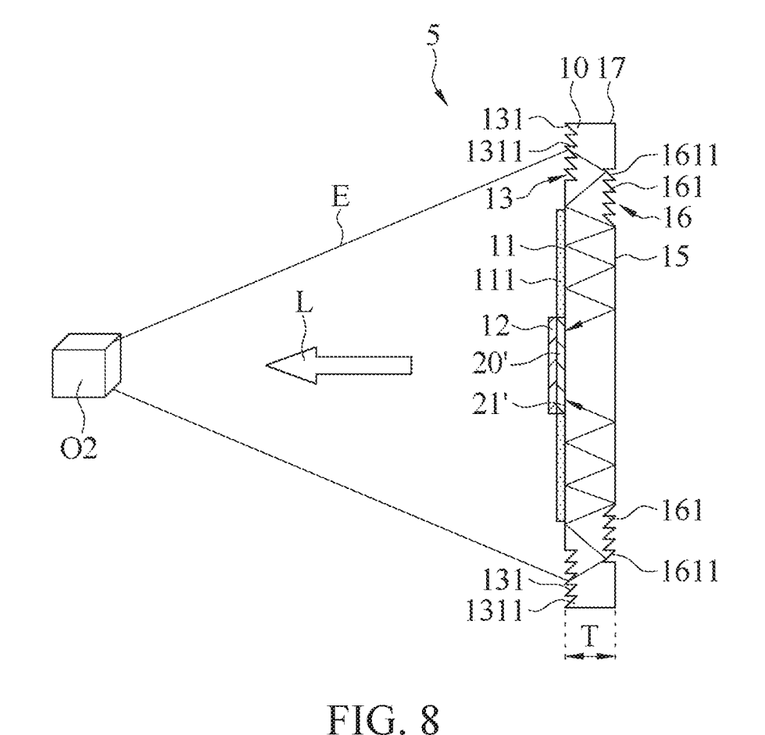
FIG. 8 illustrates a sensing schematic view of a fifth embodiment of the thin proximity sensing device according to the instant disclosure.

As shown in FIG. 1 and FIG. 2, the light sensor 20 includes a light receiving area 21. The light sensor 20 is arranged on the transparent plate 10, with the light receiving area 21 facing to the thickness T direction of the transparent plate 10, and is capable of receiving the light transmitted within the thickness T of the transparent plate 10. For example, in the present embodiment, the light sensor 20 is arranged on the second surface 15 of the transparent plate 10 and corresponds to the light source 12 on the first surface 11, but the instant disclosure is not limited thereto. The light sensor 20 and the light source 12 may also be arranged staggered with each other. Alternatively, as shown in FIG. 8, in other embodiments, the light sensor 20' may also be arranged on the first surface 11 and located between the first surface 11 and the light source 12, but the instant disclosure is not limited thereto. The light sensor 20' may also be arranged on the first surface 11 and be staggered with the light source 12, and the light receiving area 21' of the light sensor 20' faces to the thickness T direction of the transparent plate 10.

In some embodiments, the light sensor 20 may be specifically a photosensitive element, for example, a Charge Coupled Device (CCD), a Complementary Metal-Oxide Semiconductor CMOS) or a CMOS active pixel sensor, so as to sense light entering the transparent plate 10.

Figure 3:
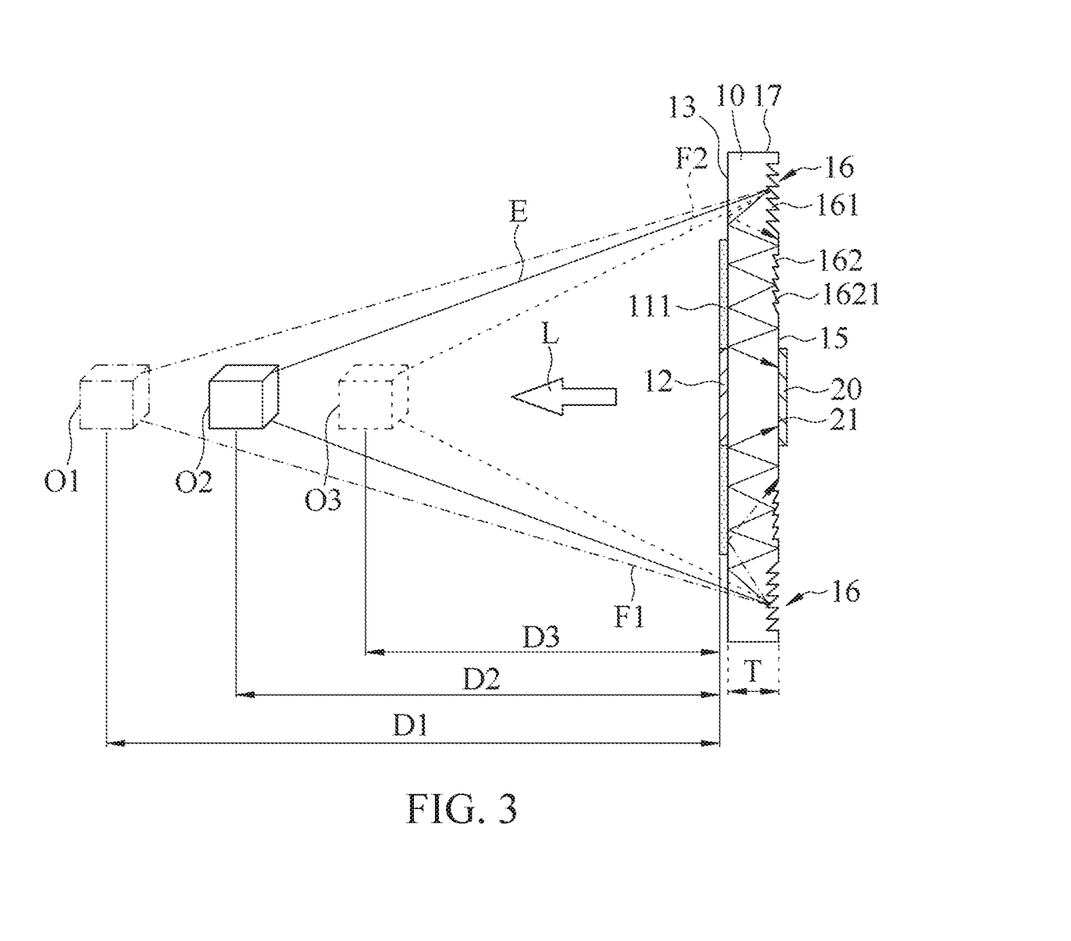
FIG. 3 illustrates a sensing schematic view of the first embodiment of the thin proximity sensing device according to the instant disclosure.

As shown in FIG. 1 to FIG. 3 which is a sensing schematic view of the thin proximity sensing device according to embodiment 1 of the instant disclosure, the second surface 15 of the transparent plate 10 of the thin proximity sensing device 1 is provided with a reflector 16 corresponding to the light entering area 13. For example, in the present embodiment, the light entering area 13 is located around the first surface 11, and the reflector 16 is also located around the second surface 15 to correspond to the light entering area 13 on the first surface 11. The reflector 16 is capable of reflecting specific incident light E which enters from the light entering area 13 on the first surface 11, such that the specific incident light E can be reflected one or more times within the thickness T of the transparent plate 10 and transmitted to the light sensor 20 after reflected by the reflector 16. That is to say, the reflector 16 is capable of reflecting the specific incident light E to a specific angle within the thickness T of the transparent plate 10, such that the specific incident light E can be smoothly transmitted to the light sensor 20, which will be described in detail with reference to the drawings as follows.

As shown in FIG. 3, the thin proximity sensing device 1 according to the embodiment of the instant disclosure continuously emits light (for example, emits illuminating light L) through the light source 12 in the sensing process. When the illuminating light L illuminates an external object, it will generate reflected light correspondingly. The specific incident light E in the embodiment of the instant disclosure is light that enters the transparent plate 10 through the light entering area 13 on the first surface 11 after the light emitted by the light source 12 is reflected externally, and is incident to the reflector 16 at a specific angle of incidence.

As described above, as shown in FIG. 3, for example, in the present embodiment, the external object may move to different positions (such as positions O1, O2 and O3 in FIG. 3) and be spaced at different distances from the thin proximity sensing device 1. In the present example, when the external object is located at the position O1, it is spaced at distance D1 from the thin proximity sensing device 1. When the external object is located at the position O2, it is spaced at distance D2 from the thin proximity sensing device 1. When the external object is located at the position O3, it is spaced at distance D3 from the thin proximity sensing device 1. The distance D1 is greater than the distance D2, and the distance D2 is greater than the distance D3. When the external object moves to different positions, different reflected light paths may be generated, and the light enters the transparent plate 10 through the light entering area 13 on the first surface 11. The thin proximity sensing device 1 according to the present embodiment is configured to sense whether the external object is located at the specific distance D2 or is proximate to the specific position O2. The design of the reflector 16 on the second surface 15 of the transparent plate 10 may aim at the reflected light path of the external object at the position O2. For example, the reflector 16 on the second surface 15 may be a directional reflector, the reflected light generated by the external object at the position O2 due to the illumination of the illuminating light L may enter the transparent plate 10 from the light entering area 13 on the first surface 11, and is incident to the reflector 16 at a specific incident angle (i.e., the above-mentioned specific incident light E).

Figure 4:
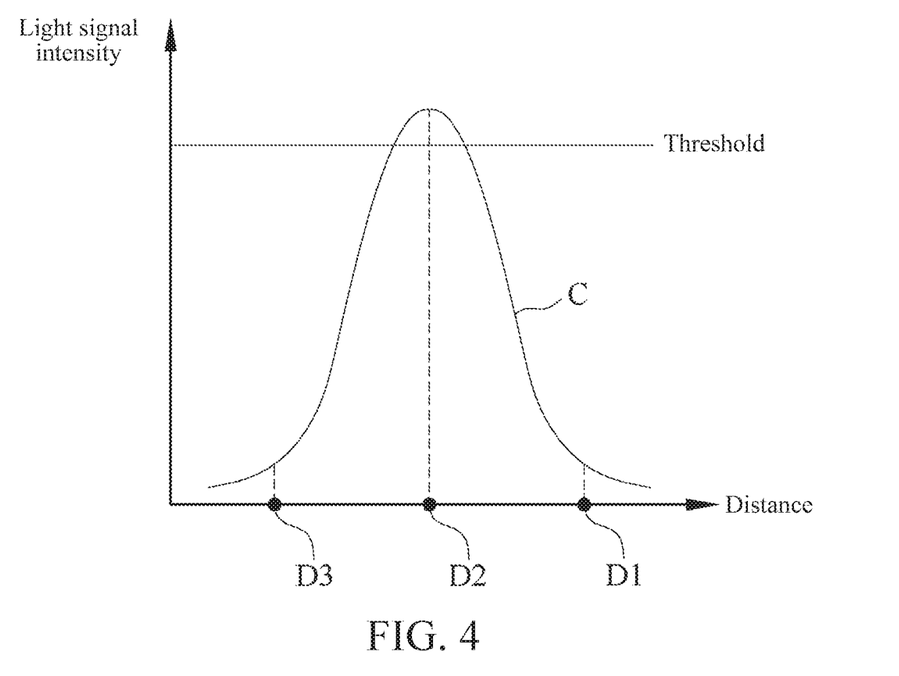
FIG. 4 illustrates a sensing curve chart of the first embodiment of the thin proximity sensing device according to the instant disclosure.

Also as shown in FIG. 3, the above reflector 16 is designed to be capable of reflecting the specific incident light E with a specific incident angle reflected by the specific position O2 to a specific direction and angle, and transmitting it to the first surface 11. For example, the incident angle of the specific incident light E illuminating the first surface 11 is enabled to be larger than a critical angle, such that the specific incident light E can be reflected within the thickness T of the transparent plate 10 and transmitted to the light sensor 20. For example, after reflected by the reflector 16, the specific incident light E may be subjected to Total Internal Reflection (TIR) within the thickness T of the transparent plate 10, or partial reflection to form a zigzag reflection path, such that it is smoothly reflected and transmitted to the light sensor 20. When the light sensor 20 detects that the brightness of the specific incident light E is greater than a threshold, it may output a corresponding signal (for example, a switching signal or a proximity signal). As shown in FIG. 3 and FIG. 4, since the reflector 16 is designed to reflect only the specific incident light E reflected by the specific position O2 to a specific direction and angle to transmit it to the light sensor 20, when the external object is located at the position O1 and is spaced at distance D1 from the thin proximity sensing device 1, the reflected light generated by the external object illuminated by the illuminating light L cannot be transmitted to the light sensor 20, Therefore, the light signal intensity sensed by the light sensor 20 cannot reach the threshold (as shown by curve C in FIG. 4, the light signal intensity corresponding to distance D1 is far lower than the threshold). When the external object moves to the position O2 and is spaced at distance D2 from the thin proximity sensing device 1, the reflected light generated by the external object illuminated by the illuminating light L can be reflected by the reflector 16 to a specific direction and angle, and is reflected within the thickness T of the transparent plate 10 and transmitted to the light sensor 20. At this moment, the light signal intensity sensed by the light sensor 20 is the strongest and higher than the threshold (as shown in curve C in FIG. 4, the light signal intensity corresponding to distance D2 is higher than the threshold), so as to output a corresponding signal (for example, a switching signal or a proximity signal). When the external object moves to the position O3 and is spaced at distance D3 from thin proximity sensing device 1, the reflected light generated by the external object illuminated by the illuminating light L cannot be transmitted to the light sensor 20, so the light signal intensity sensed by the light sensor 20 cannot reach the threshold and a corresponding signal is not output (as shown in curve C in FIG. 4, the light signal intensity corresponding to distance D3 is far lower than the threshold).

It can be seen from the above description that the threshold may correspond to a specific distance (i.e., the distance D2) such that the reflected light generated by the external object at the specific distance D2 can be reflected to a specific direction and angle by the reflector 16, and is reflected within the thickness T of the transparent plate 10 and transmitted to the light sensor 20, such that the light signal intensity received by the light sensor 20 is greater than the threshold. When the external object is not located at the specific distance D2, the reflected light cannot be reflected in the transparent plate 10 and transmitted to the light sensor 20. Therefore, the light sensor 20 can determine the above-mentioned specific distance D2 according to the light signal intensity.

In some embodiments, the reflector 16 on the second surface 15 of the transparent plate 10 may be provided with an optical microstructure 161 to reflect the specific incident light E with the specific incident angle to a specific direction and angle through the optical microstructure 161 and transmit it to the first surface 11. For example, as shown in FIG. 2 and FIG. 3, in the present embodiment, the optical microstructure 161 is a zigzag reflective structure and is provided with a plurality of tooth parts 1611. Each tooth part 1611 is provided with an inclined tooth surface with a predetermined inclination angle, so as to reflect the specific incident light E with the specific incident angle to a specific angle such that it can be reflected within the thickness T of the transparent plate 10 through the inclined tooth surface. The optical microstructure 161 may be formed on the reflector 16 by means of metal printing, etching or other processing methods. In some embodiments, the optical microstructure 161 may also be any one of other microstructures, for example, reflective gratings, reflective sheets or dots, but the instant disclosure is not limited thereto.

As shown in FIG. 3, since the reflector 16 on the second surface 15 of the transparent plate 10 is designed for the reflected light path of the external object at the position O2, when the external object is located at other positions (for example, positions O1 and O3 in FIG. 3), the generated reflected light cannot be transmitted to the light sensor 20, so the corresponding signal cannot be generated. In particular, taking that the external object is located at the position O1 as an example, the reflected light F1 generated by the external object at the position O1 due to the illumination of the illuminating light L can enter the transparent plate 10 from the light entering area 13 on the first surface 11 and be incident to the reflector 16. Since the incident angle of the reflected light F1 is different from that of the specific incident light E, the reflected light F1 cannot be reflected by the reflector 16 to a specific direction and angle and transmitted to the first surface 11, such that it cannot be continuously reflected within the thickness T of the transparent plate 10 and transmitted to the light sensor 20 (for example, most of the light of the reflected light F1 is refracted out of the transparent plate 10). Similarly, taking that the external object is located at the position O3 as an example, the reflected light F2 generated by the external object at the position O3 due to the illumination of the illuminating light L can enter the transparent plate 10 from the light entering area 13 on the first surface 11 and be incident to the reflector 16. Since the incident angle of the reflected light F2 is different from that of the specific incident light E, the reflected light F2 cannot be reflected by the reflector 16 to a specific direction and angle and transmitted to the first surface 11 (for example, the incident angle of the first surface 11 is less than the critical angle), such that it cannot be continuously reflected within the thickness T of the transparent plate 10 and transmitted to the light sensor 20.

That is to say, as shown in FIG. 3, the reflector 16 is designed to reflect only the specific incident light E with the specific angle to a specific direction and angle to transmit it to the light sensor 20. After the light reflected by the external object at different positions, or other light (such as sunlight, illuminating light or ambient light) with different incident angles from the specific incident light E enters the transparent plate 10 from the light entering area 13 on the first surface 11, all of them cannot be smoothly transmitted to the light sensor 20. Therefore, the thin proximity sensing device 1 according to the embodiment of the instant disclosure can achieve the effect of greatly improving the accuracy of object sensing.

As shown in FIG. 2 and FIG. 3, the second surface 15 of the transparent plate 10 may be further provided with a reflective microstructure 162. The reflective microstructure 162 is located between the optical microstructure 161 and the light sensor 20. After reflected by the optical microstructure 161 of the reflector 16, the specific incident light E is further reflected by the reflective microstructure 162, and is reflected many times within the thickness T of the transparent plate 10 and transmitted to the light sensor 20. In the present embodiment, the reflective microstructure 162 is a zigzag reflective structure and is provided with a plurality of tooth parts 1621. The reflective microstructure 162 is used to enable the specific incident light E reflected by the optical microstructure 161 of the reflector 16 to be continuously reflected within the thickness T of the transparent plate 10 and transmitted to the light sensor 20. The angle of the inclined tooth surface of each tooth part 1621 of the reflective microstructure 162 and the angle of the inclined tooth surface of each tooth part 1611 of the optical microstructure 161 may be the same or different (here the angle of the inclined tooth surface of each tooth part 1621 of the reflective structure 162 is different from the angle of the inclined tooth surface of each tooth part 1611 of the optical microstructure 161). The reflective microstructure 162 may be formed by means of metal printing, etching or other processing methods. In some embodiments, the reflective microstructure 162 may also be any one of other microstructures, such as reflective gratings, reflective sheets or dots, but the instant disclosure is not limited thereto.

Figure 5:
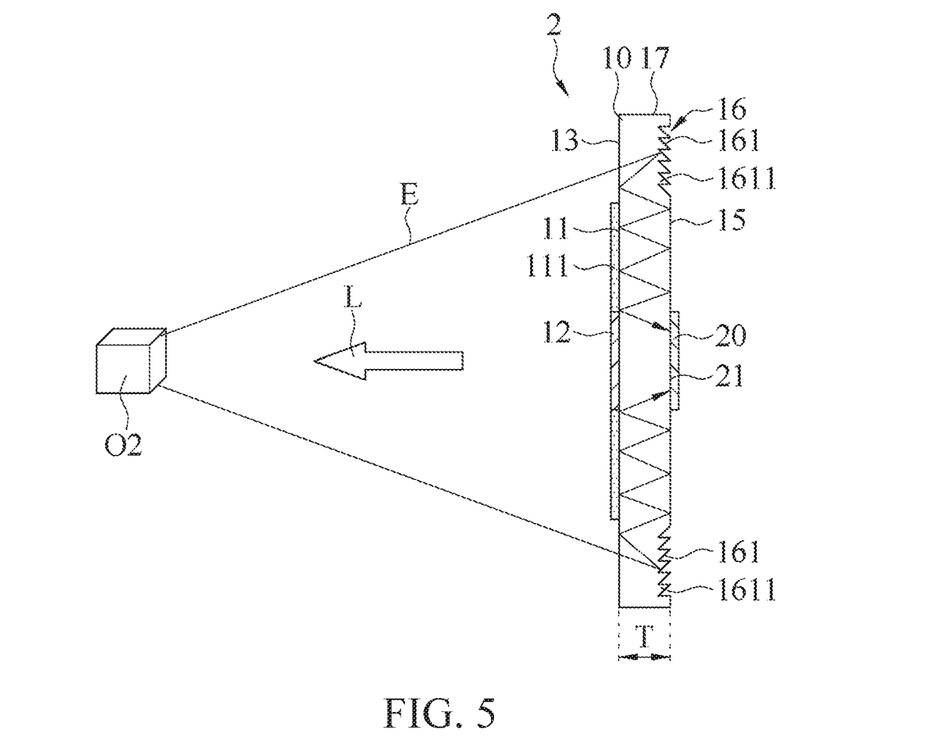
FIG. 5 illustrates a sensing schematic view of a second embodiment of the thin proximity sensing device according to the instant disclosure.

As shown in FIG. 5, it illustrates a thin proximity sensing device according to embodiment 2 of the instant disclosure. The difference between the present embodiment and the embodiment shown in FIG. 3 is that the second surface 15 of the transparent plate 10 of the thin proximity sensing device 2 in the present embodiment is only provided with an optical microstructure 161 on the reflector 16. After the specific incident light E enters the transparent plate 10 from the light entering area 13 on the first surface 11, it is reflected by the optical microstructure 161 of the reflector 16 to a specific direction and angle, such that it is reflected one or more times within the thickness T of the transparent plate 10 and transmitted to the light sensor 20.

Figure 6:
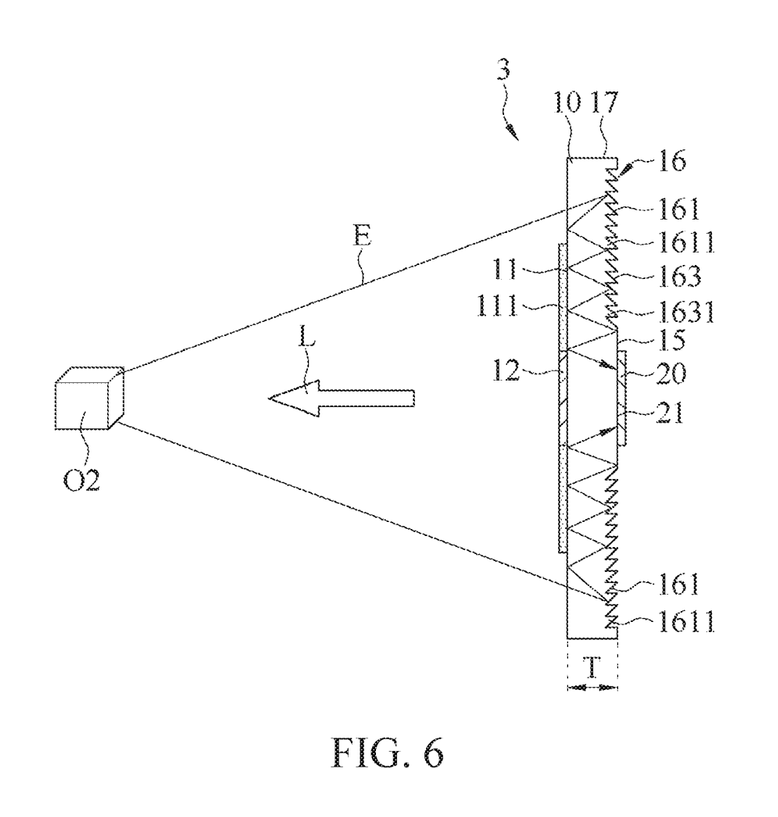
FIG. 6 illustrates a sensing schematic view of a third embodiment of the thin proximity sensing device according to the instant disclosure.

As shown in FIG. 6, it illustrates a thin proximity sensing device according to embodiment 3 of the instant disclosure. The difference between the present embodiment and the embodiment shown in FIG. 3 is that the second surface 15 of the transparent plate 10 of the thin proximity sensing device 3 in the present embodiment is further provided with a reflective microstructure 163. The reflective microstructure 163 is located between the optical microstructure 161 and the light sensor 20. In addition, the reflective microstructure 163 is further connected with the optical microstructure 161. The angle of the inclined tooth surface of each tooth part 1631 of the reflective microstructure 163 is the same as the angle of the inclined tooth surface of each tooth part 1611 of the optical microstructure 161. After reflected by the optical microstructure 161 of the reflector 16, the specific incident light E is further reflected by the reflective microstructure 163, and is reflected many times within the thickness T of the transparent plate 10 and transmitted to the light sensor 20. In some embodiments, the optical microstructure 161 and the reflective microstructure 163 may also be other microstructures, such as reflective gratings, reflective sheets or dots, but the instant disclosure is not limited thereto.

Figure 7:
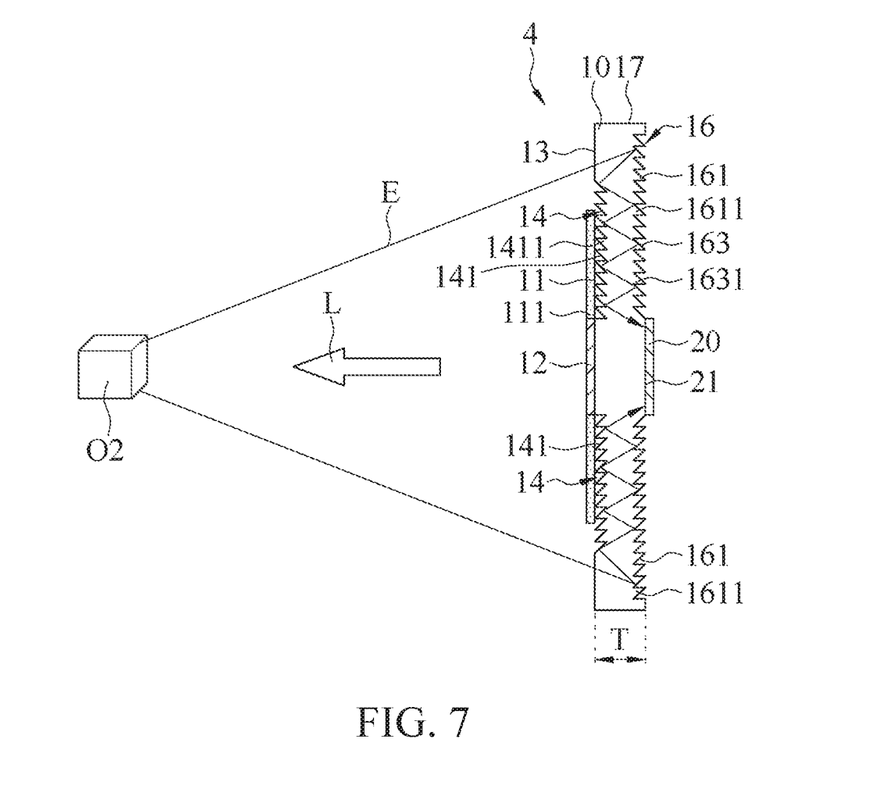
FIG. 7 illustrates a sensing schematic view of a fourth embodiment of the thin proximity sensing device according to the instant disclosure.

As shown in FIG. 7, it illustrates a thin proximity sensing device according to embodiment 4 of the instant disclosure. The difference between the present embodiment and the embodiment shown in FIG. 6 is that the first surface 11 of the thin proximity sensing device 4 in the present embodiment includes a reflecting area 14. Here the reflecting area 14 is different from other areas of the light entering area 13. After sequentially reflected by the reflector 16 and the reflecting area 14, the specific incident light E is reflected within the thickness T of the transparent plate 10 and transmitted to the light sensor 20.

As shown in FIG. 7, the reflection area 14 of the first surface 11 may be provided with a reflective microstructure 141. In the present embodiment, the reflective microstructure 141 may be a zigzag reflective microstructure with a plurality of tooth parts 1411. The reflective microstructure 141 is also used to enable the light reflected by the optical microstructure 161 of the reflector 16 to be continuously reflected within the thickness T of the transparent plate 10 and transmitted to the light sensor 20. The angle of the inclined tooth surface of each tooth part 1411 of the reflective microstructure 141 may be the same as or different from the angle of the inclined tooth surface of each tooth part 1611, 1631 of the optical microstructure 161, 163. The reflective microstructure 141 may be formed by means of metal printing, etching or other processing methods. In some embodiments, the reflective microstructure 141 may also be any one of other microstructures, such as reflective gratings, reflective sheets or dots, but the instant disclosure is not limited thereto.

As shown in FIG. 8, it illustrates a thin proximity sensing device according to embodiment 5 of the instant disclosure. The difference between the present embodiment and the embodiment shown in FIG. 5 is that the light entering area 13 on the first surface 11 of the transparent plate 10 of the thin proximity sensing device 5 in the present embodiment is provided with a light polarizing microstructure 131. The reflected light correspondingly generated by the external object illuminated by the illuminating light L is polarized by the light polarizing microstructure 131 of the light entering area 13 on the first surface 11 to form specific incident light E which enters the transparent plate 10 and is incident to the reflector 16 at a specific incident angle.

As shown in FIG. 8, the light polarizing microstructure 131 on the light entering area 13 may be a zigzag reflective microstructure with a plurality of tooth parts 1311, such that the reflected light correspondingly generated by the external object illuminated by the illuminating light L can be polarized and changed in the direction through the inclined tooth surface of each tooth part 1311 after passing through the plurality of tooth parts 1311, and thus is incident to the reflector 16 at a specific incident angle. In some embodiments, the light polarizing microstructure 131 may also be any one of other microstructures, such as gratings, dots or other materials different from the material of the transparent plate 10, but the instant disclosure is not limited thereto.

Although the instant disclosure has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A thin proximity sensing device, comprising:
a transparent plate, comprising a thickness and comprising a first surface and an opposite second surface, the first surface being provided with a light source and a light entering area, the light source being arranged on the first surface along a direction of emitting light towards outside of the transparent plate, the light source and the light entering area being located at different positions on the first surface, and the second surface being provided with a reflector corresponding to the light entering area; and
a light sensor, comprising a light receiving area, the light sensor being arranged on the transparent plate, with the light receiving area facing to a thickness direction of the transparent plate;
wherein the reflector is capable of correspondingly reflecting specific incident light, the specific incident light refers to light that enters the transparent plate through the light entering area on the first surface after the light emitted by the light source is reflected externally, and is incident to the reflector;
wherein after reflected by the reflector, the specific incident light is reflected one or more times within the thickness of the transparent plate and is transmitted to the light sensor.

2. The thin proximity sensing device according to claim 1, wherein when the light sensor detects that a brightness of the specific incident light is greater than a threshold, correspondingly outputting a proximity signal.

3. The thin proximity sensing device according to claim 2, wherein the threshold corresponds to a specific distance.

4. The thin proximity sensing device according to claim 1, wherein the reflector refers to a directional reflector.

5. The thin proximity sensing device according to claim 1, wherein the reflector is provided with an optical microstructure.

6. The thin proximity sensing device according to claim 1, wherein the transparent plate is a light guide film.

7. The thin proximity sensing device according to claim 1, wherein the light sensor is arranged on the second surface of the transparent plate and corresponds to the light source on the first surface.

8. The thin proximity sensing device according to claim 1, wherein the light sensor is arranged on the first surface of the transparent plate and is located between the first surface and the light source.

9. The thin proximity sensing device according to claim 1, wherein the first surface comprises a reflecting area, and the specific incident light is reflected sequentially by the reflector and the reflecting area, then is reflected one or more times within the thickness of the transparent plate and is transmitted to the light sensor.

10. The thin proximity sensing device according to claim 1, wherein the light entering area is provided with a light polarizing microstructure.

11. The thin proximity sensing device according to claim 1, wherein the first surface is further provided with a light shielding layer and the light shielding layer is located between the light source and the light entering area.

* * * * *